(12) United States Patent
Schelenz et al.

(10) Patent No.: US 9,178,410 B2
(45) Date of Patent: Nov. 3, 2015

(54) ADAPTIVE POWER CONVERSION SYSTEM

(75) Inventors: Owen Jannis Samuel Schelenz, Schenectady, NY (US); David Smith, Daleville, VA (US)

(73) Assignee: General Electric Company, Niskayuna, NY (US)

( * ) Notice: Subject to any disclaimer, the term of this patent is extended or adjusted under 35 U.S.C. 154(b) by 400 days.

(21) Appl. No.: 13/344,631

(22) Filed: Jan. 6, 2012

(65) Prior Publication Data
US 2013/0176752 A1 Jul. 11, 2013

(51) Int. Cl.

| | |
|---|---|
| *H02M 7/5387* | (2007.01) |
| *H02M 1/088* | (2006.01) |
| *H02M 1/32* | (2007.01) |
| *H05K 7/14* | (2006.01) |
| H02J 3/36 | (2006.01) |
| H02M 3/158 | (2006.01) |
| H02J 3/38 | (2006.01) |
| H02M 7/539 | (2006.01) |

(52) U.S. Cl.
CPC ............... *H02M 1/088* (2013.01); *H02M 1/32* (2013.01); *H05K 7/1432* (2013.01); *H02J 3/383* (2013.01); *H02M 3/1584* (2013.01); *H02M 7/539* (2013.01); *H02M 2001/325* (2013.01); *Y02E 10/563* (2013.01)

(58) Field of Classification Search
CPC  H01L 23/053; H02M 5/4585; H02M 7/5387; H02M 3/1584; H02J 3/36
USPC ............ 363/34, 35, 50, 51, 55, 56.01, 56.02, 363/89, 98, 132; 323/906, 271, 272; 257/683
See application file for complete search history.

(56) References Cited

U.S. PATENT DOCUMENTS

| | | | |
|---|---|---|---|
| 5,930,122 A | 7/1999 | Moriguchi et al. | |
| 6,097,582 A | 8/2000 | John et al. | |
| 6,169,670 B1 | 1/2001 | Okubo et al. | |
| 6,549,438 B2 | 4/2003 | Malone | |
| 7,274,576 B1 * | 9/2007 | Zargari et al. | 363/39 |
| 7,915,878 B2 * | 3/2011 | Komori | 323/272 |
| 8,188,720 B2 * | 5/2012 | Kim et al. | 323/272 |
| 8,391,033 B2 * | 3/2013 | Alexander | 363/50 |
| 8,614,904 B2 * | 12/2013 | Norrga et al. | 363/127 |
| 2002/0057587 A1 * | 5/2002 | Ruthlein et al. | 363/132 |
| 2003/0179595 A1 | 9/2003 | Kleveland | |
| 2009/0250799 A1 * | 10/2009 | Billmann et al. | 257/683 |
| 2010/0080024 A1 | 4/2010 | Wei et al. | |
| 2011/0085363 A1 | 4/2011 | Gupta et al. | |
| 2012/0068678 A1 * | 3/2012 | Hatae et al. | 323/272 |

FOREIGN PATENT DOCUMENTS

| | | |
|---|---|---|
| EP | 1701435 A1 | 9/2006 |
| EP | 2190015 A1 | 5/2010 |

OTHER PUBLICATIONS

Baba et. al,; Abstract; "A Half-Bridge Inverter Based Current Balancer With the Reduced Dc Capacitors in Single-Phase Three-Wire Distribution Feeders", Energy Conversion Congress and Exposition (ECCE), 2011 IEEE, Print ISBN: 978-1-4577-0542-7, on pp. 4233-4239,Issue Date: Sep. 17-22, 2011.

* cited by examiner

*Primary Examiner* — Gary L Laxton
(74) *Attorney, Agent, or Firm* — Ann M. Agosti

(57) ABSTRACT

A power converter includes a plurality of switches electrically coupled to each other for converting input power to output power. Each of the switches is sufficiently isolated to protect adjacent switches upon failure of one or more switches. The power converter also includes a controller for reconfiguring operation of the switches to provide at least a partial operating mode upon a switch failure.

9 Claims, 2 Drawing Sheets

ADAPTIVE POWER CONVERSION SYSTEM

BACKGROUND

The invention generally relates to power conversion systems and, more particularly, to power conversion systems being able to withstand certain switch failures.

With the rising cost and scarcity of conventional energy sources and concerns about the environment, there is a significant interest in alternative energy sources such as solar power and wind power. The alternative energy sources are used to generate power by employing different power conversion systems for different alternative sources of energy. A power conversion system generally includes at least one power converter for converting generated power from at least one power source to usable power for transmission to a power grid.

The power conversion system includes one or more stages of power conversion to provide the usable power. Each stage includes a plurality of switches that convert the input power from the power source. The switches are susceptible to damage due to various conditions such as current overloading. The failure of any one of the switches in a conventional power converter leads to temporary suspension of the operation of the whole power converter until the failed switch is replaced. The temporary suspension of the power converter results in power production losses and reduced operational time. Furthermore, the failure also negatively impacts the power converter's availability rating when it is still largely functional although not able to operate due to the failure of a single component.

The failure of a switch may also result in an explosion that creates undesired projectiles of debris from the exploded switch. The undesired projectiles may damage the adjacent switches.

Hence, there is a need for an improved system to address the aforementioned issues.

BRIEF DESCRIPTION

In one embodiment, a power converter is provided. The power converter includes switches electrically coupled to each other and configured to convert input power to output power, wherein each of the switches is sufficiently isolated to protect adjacent switches upon failure of one or more of the switches. The power converter also includes a controller for reconfiguring operation of the switches to provide at least a partial operating mode upon failure of the one or more switches.

In another embodiment, a power conversion system is provided. The power conversion system includes a DC-DC power converter comprising at least two legs coupled in parallel, each leg comprising at least two switches couplable at a midpoint to a DC power source and sufficiently isolated to protect adjacent switches upon failure of one or more of the switches. The power conversion system also includes a controller for controlling operating time of the switches of the at least two legs to provide a combined DC output power and, upon failure of at least one of the switches in one of the at least two legs, adjusting the operating time of at least the switches of the remainder of the at least two legs to provide a reduced combined DC output power.

In yet another embodiment, a power conversion system comprising a DC-AC power converter is provided. The DC-AC power converter includes at least two phase legs coupled in parallel, each leg comprising at least two sets of switches coupled in series, wherein each of the at least two sets comprises a plurality of switches electrically coupled in parallel to each other and sufficiently isolated to protect adjacent switches upon failure of one or more of the switches. The power conversion system also includes a controller for controlling a combined AC output power by adjusting AC output power generated from each phase leg upon failure of at least one of the switches in at least one of the two sets of switches.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean one, some, or all of the listed items. The use of "including," "comprising" or "having" and variations thereof herein are meant to encompass the items listed thereafter and equivalents thereof as well as additional items. The terms "connected" and "coupled" are not restricted to physical or mechanical connections or couplings, and can include electrical connections or couplings, whether direct or indirect. Furthermore, the terms "circuit" and "circuitry" and "controller" may include either a single component or a plurality of components, which are either active and/or passive and are connected or otherwise coupled together to provide the described function.

Embodiments of the present invention include an adaptive power converter that includes switches electrically coupled to each other and configured to convert input power to output power. Each of the switches is sufficiently isolated to protect adjacent switches upon failure of one or more switches. The power converter also includes a controller for reconfiguring operation of the switches to provide at least a partial operating mode upon failure of the one or more switches.

Figure 1:
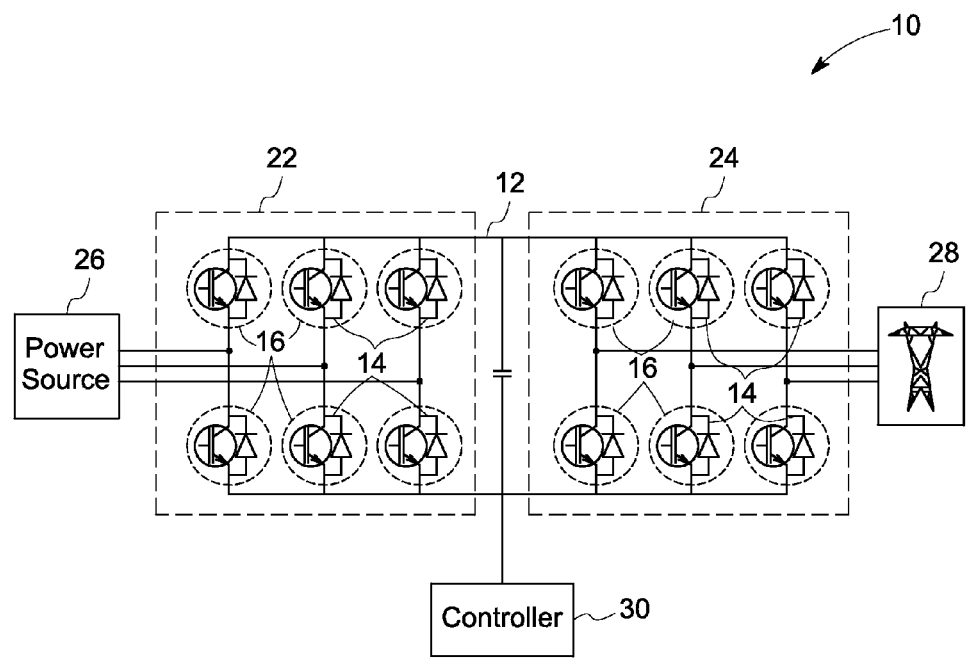
FIG. 1 is a schematic representation of a power converter including a plurality of sufficiently isolated switches in accordance with an embodiment of the invention.

FIG. 1 is a schematic representation of a power conversion system 10 comprising a power converter 12 including a plurality of sufficiently isolated switches 14 in accordance with an embodiment of the invention. The switches 14 are electrically coupled to each other and convert input power to an output power. Each of the switches 14 is sufficiently isolated to protect adjacent switches upon failure of one or more of the switches. In one embodiment, each of the plurality of switches is sufficiently isolated by a blast shield. In other embodiments, the switches may be separated by compartments or sufficient physical distance, for example. For purposes of example, the invention will be discussed in greater detail below with respect to the blast shield.

Figure 2:
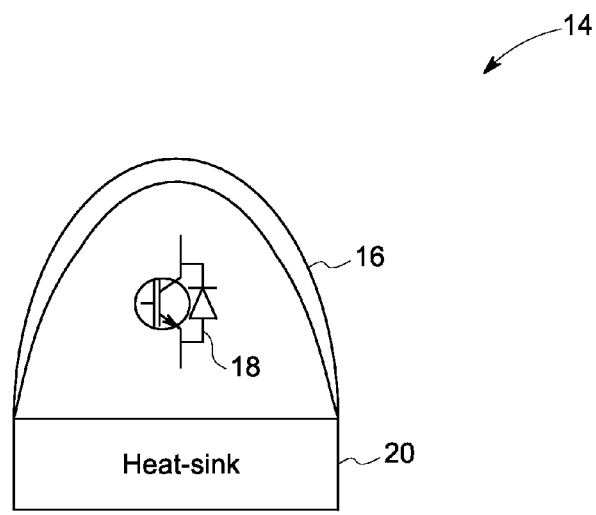
FIG. 2 is a more detailed schematic representation of a switch sufficiently isolated by a blast shield provided in a power converter in accordance with an embodiment of the invention.

FIG. 2 is a schematic representation of a blast shield-encased switch 14. The blast shield-encased switch 14 comprises a power switch 18 mounted on a heat sink 20. Power switch 18 may comprise a semiconductor switch, for example. In one more specific embodiment, the switch 18 comprises an insulated gate bipolar transistor. The switch 18 is further encased in a blast shield 16 that protects the adjacent switches from damage by restricting any explosion caused upon failure of the encased switch. In one embodiment, the blast shield comprises a fiber material, a composite material, or combinations thereof. In a more specific embodiment, the blast shield 16 comprises woven para-aramid synthetic fibers such as Kevlar™ fibers, fiberglass material, other high strength composite materials, or combinations thereof.

Referring back to FIG. 1, the switches 14 convert the input power to the output power. In a non-limiting example, the input power may include DC power or AC power, and the output power includes AC power. In one embodiment, the switches 14 are electrically coupled in such a manner that the input power is converted to the output power in two stages including a first stage 22 including one of an AC-DC conversion stage or a DC-DC conversion stage and a second stage 24 including a DC-AC conversion stage. In a specific embodiment, the first stage 22 comprises an AC-DC power conversion stage in wind turbine applications, and the first stage comprises a DC-DC conversion stage in solar power applications. In an exemplary embodiment, each stage includes three legs.

The first stage 22 of power conversion in the power converter 12 is electrically coupled to a power source 26. In one embodiment, the power source 26 may include a solar power source, a wind power source, a battery, or a fuel cell. The first stage 22 receives the input power from the power source 26 and converts the input power to a combined DC power. The second stage 24 of power conversion in the power converter 12 receives the combined DC power and converts the combined DC power to the output power that is fed to a power grid 28.

The power converter 12 includes a controller 30 that controls the operation of the switches 14 to convert the input power to the output power. While in operation, one or more of the switches 14 may be damaged. The blast shields 16 (shown in FIG. 2) protect the adjacent switches from damage and limit the explosion of the damaged switch or switches. The controller 30 reconfigures the operation of the undamaged switches to operate the power converter 12 in at least a partial operating mode until the failed switch has been replaced. In one embodiment, the power converter includes an inverter operating at at least one megawatt.

Figure 3:
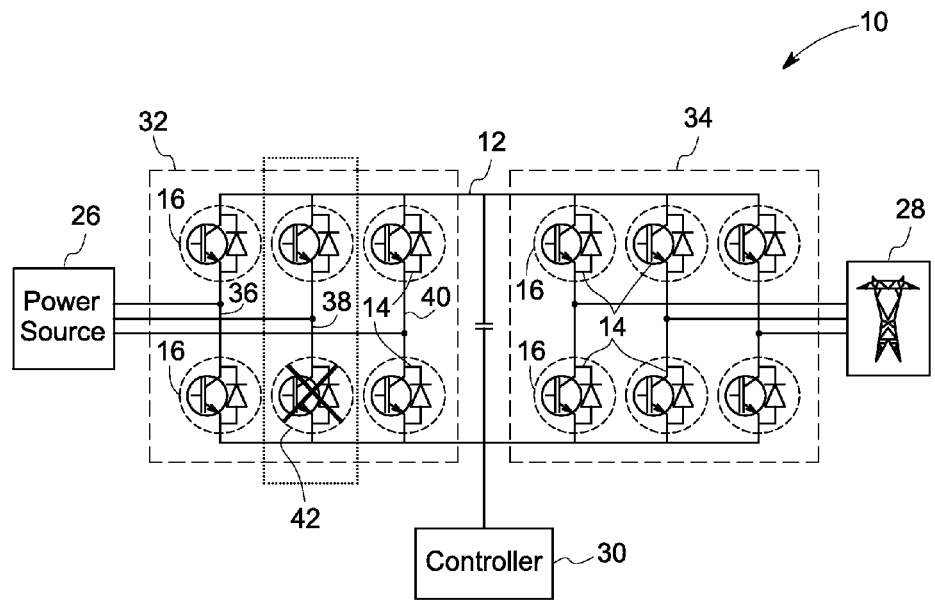
FIG. 3 is a schematic representation of a power conversion system including an adaptive DC-DC converter comprising exactly two switches sufficiently isolated by blast shield in each leg of the adaptive DC-DC power converter in accordance with an embodiment of the invention.

FIG. 3 is a schematic representation of a power conversion system 10 including an adaptive DC-DC converter 32 comprising two switches 14, each switch sufficiently isolated by a blast shield in each leg of the adaptive DC-DC converter 32 in accordance with an embodiment of the invention. For better understanding of the invention, the operation of the power converter 12 described above would be discussed with respect to a solar power conversion system 10 comprising the DC-DC converter 32 in the first stage 22 and a DC-AC converter 34 in the second stage 24 of the power converter 12. The solar power conversion system 10 includes a solar power source 26 that generates input DC power that is fed to the DC-DC converter 32 in the power converter 12. The DC-DC converter 32 in the specific example comprises at least two legs (shown as three legs 36, 38 and 40 for purposes of example) that are coupled in parallel. Each leg includes at least two blast shield encased switches 14 couplable at midpoint to the solar power source 26. In one embodiment, each leg includes exactly two blast shield-encased switches 14. In another embodiment, more than two switches may be used per leg. The DC-DC converter 32 is coupled to the controller 30 that controls the operation of the switches 14 by interleaving DC output power generated from each of the at least three legs 36, 38 and 40 to provide the combined DC output power.

During operation, upon failure of at least one of the switches 42, the controller 30 adjusts the switching time of the remaining switches to provide a reduced combined DC output power. In the specific embodiment, wherein, each leg includes exactly two switches 14 and at least one of the switches 42 in the at least one leg 38 have failed, the entire leg 38 is rendered unusable, and the controller 30 adjusts the gating of the remaining legs 36 and 40 to provide the reduced combined DC output power. In this embodiment, although one of the legs 38 has failed, the remaining legs 36 and 40 may still operate at full capacities and provide the reduced combined DC power that is generated by the remaining legs 38 and 40. In this embodiment, the controller 30 operates each the remaining switches to provide a balanced level of DC output power from each of the remaining legs 36 and 40. Furthermore, if a leg fails completely and has to be removed from operation, to provide a reduced or minimum DC ripple, the controller redistributes the operating time of the remaining switches such that the remaining switches operate at equidistant times without leaving an unaccounted time slot of the failed leg. In cases where all or too many legs have switch failures such that it is not possible to provide a balanced level of DC output power, the controller 30 may need to shut down the operation of the DC-DC converter 32.

The combined DC output power from the DC-DC converter 32 is then transmitted to the DC-AC converter 34 to convert the combined DC output power to the output power.

Figure 4:
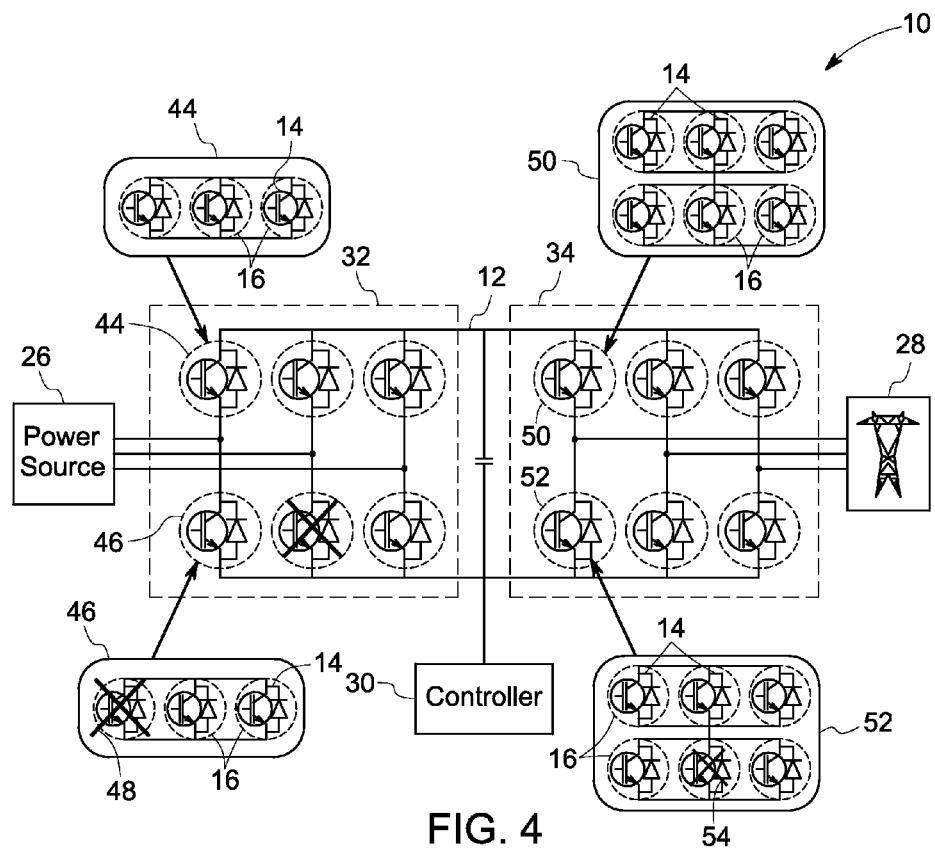
FIG. 4 is a schematic representation of a power conversion system including an adaptive DC-DC power converter and an adaptive DC-AC power converter.

FIG. 4 is a schematic representation of the solar power conversion system 10 including an adaptive DC-DC converter 32 and an adaptive DC-AC converter 34 wherein redundant switches are included in accordance with another embodiment of the invention. In the embodiment of FIG. 4, the DC-DC converter 32 and the DC-AC converter 34 each comprise two sets 44 and 46 of switches electrically coupled in parallel in each leg of the respective power converters 32 and 34.

The DC-DC converter 32 includes two sets 44 and 46 of blast shield encased switches 14 electrically coupled in parallel in each leg of the DC-DC converter 32 and converts the input DC power to the combined DC output power. The controller 30 controls the operations of the plurality of blast shield encased switches 14 to convert the input power to the combined DC power. The controller 30 reconfigures the switching operation of the switches 14 to adjust the combined DC power upon failure of at least one of the switches 48 in at least one of the sets 44 and 46 in one or more legs of the DC-DC converter 32. When only a switch, such as switch 48 in FIG. 4, fails in a given set 44, then the entire leg need not be shut down in this embodiment. Instead, the gating may be adjusted to account for the loss of the switch and also adjust the values of expected current flows used within the DC-DC converter 32 controls. In this embodiment, when one of the switches such as 48 has failed, the leg 36 (FIG. 3) operates at a reduced capacity and the remaining legs 36 (FIG. 3) and 40 (FIG. 3) may optionally operate at full capacities to provide the reduced combined DC power. If an entire set 44 or 46 in one leg of DC-DC converter 32 fails, then the leg is not usable, and the adjustments discussed with respect to FIG. 3 may be used. In cases where all or too many sets of legs have switch failures such that it is not possible to provide a balanced level of DC output power, the controller 30 may need to shut down the operation of the DC-DC converter 32.

The DC-AC converter 34 receives the combined DC power from the DC-DC converter 32 and converts the combined DC power to an AC power. The DC-AC converter 34 includes at least two legs coupled in parallel. Each leg includes at least two sets 50 and 52 of blast shield encased switches coupled in series. Each of the at least two sets 50 and 52 includes a plurality of blast shield encased switches 14 electrically coupled in parallel to each other. Controller 30 controls the switches 14 to provide a combined AC output power. In operation, upon failure of at least one of the switches 54 in at least one of the two sets of switches 52, the controller 30 adjusts the AC output power generated from each phase leg to provide a reduced combined AC power. In one embodiment, as the amount of voltage that the affected leg may produce is reduced, to balance the output voltage, the controller 30 may also operates the remaining legs at reduced power to provide a more balanced AC output power. In a specific embodiment, the controller 30 shuts down the operation of the DC-AC converter 34 upon failure of each of the switches of at least one set among the two sets 50 and 52. In cases where all or too many sets of legs have partial switch failures such that it is not possible to provide a balanced level of AC output power, the controller 30 may need to shut down the operation of the DC-AC converter 34.

The various embodiments of the solar power generation system described above provide a more efficient and reliable solar power generation system. The system described above enables more operational time for the power converter and reduces damages in the power converter resulting in less maintenance.

It is to be understood that a skilled artisan will recognize the interchangeability of various features from different embodiments and that the various features described, as well as other known equivalents for each feature, may be mixed and matched by one of ordinary skill in this art to construct additional systems and techniques in accordance with principles of this disclosure. It is, therefore, to be understood that the appended claims are intended to cover all such modifications and changes as fall within the true spirit of the invention.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A power conversion system comprising:
a DC-DC power converter comprising at least two legs coupled in parallel, each leg comprising at least two sets of switches couplable at a midpoint to a DC power source, wherein each of the at least two sets of switches, comprises a plurality of switches electrically coupled in parallel to each other, and wherein each of the plurality of switches is enclosed in a blast shield to protect adjacent switches upon failure of one or more of the switches; and
a controller for controlling operating time of the plurality of switches of the at least two legs to provide a combined DC output power and, wherein upon failure of at least one of the switches in one of the at least two legs, the controller adjusts the operating time of at least the switches of remainder of the at least two legs to provide a reduced combined DC output power.

2. The system of claim 1, wherein the controller is further configured for operating each of the remaining switches to provide a reduced level of DC output power ripple.

3. The system of claim 1, wherein the DC-DC power converter is coupled to a solar power source.

4. A power conversion system comprising:
a DC-AC power converter comprising at least two phase legs coupled in parallel, each leg comprising at least two sets of switches coupled in series, wherein each of the at least two sets of switches, comprises a plurality of switches electrically coupled in parallel to each other and, wherein each of the plurality of switches is enclosed in a blast shield to protect adjacent switches upon failure of one or more of the switches; and
a controller for controlling a combined AC output power by adjusting AC output power generated from each phase leg upon failure of at least one of the switches in at least one of the two sets of switches.

5. The system of claim 4, wherein the controller is configured to operate the leg comprising at least one of the failed switches to provide reduced AC output power.

6. The system of claim 4, wherein the controller is further configured to operate remaining switches of the at least one set of each leg to provide a balanced AC output power to provide a reduced combined AC power.

7. The system of claim 4, wherein the controller is configured to shut down the operation of the DC-AC power converter when each of the plurality of switches of at least one set among the two sets have failed.

8. The system of claim 4, wherein the DC-AC power converter is coupled to a renewable power generation source.

9. The system of claim 6, wherein the controller is further configured to operate the remaining switches of the at least one set of each leg to provide the balanced AC output power to provide the reduced combined AC power by lowering an amount of power produced by one or more phase legs without any failed switches to match an amount of power produced by a phase leg with the at least one of the failed switches.

\* \* \* \* \*